US011112317B2

(12) United States Patent
Hart et al.

(10) Patent No.: US 11,112,317 B2
(45) Date of Patent: Sep. 7, 2021

(54) SAFETY DEVICE FOR MONITORING A TECHNICAL INSTALLATION WITH A PRESSURE-SENSITIVE SENSOR

(71) Applicant: PILZ GMBH & CO. KG, Ostfildern (DE)

(72) Inventors: Fabian Hart, Ostfildern (DE); Onedin Ibrocevic, Ostfildern (DE); Matthias Kuczera, Ostfildern (DE); Matthias Schweiker, Ostfildern (DE); Bernd Neuschwander, Ostfildern (DE); Fabian Tekdal, Ostfildern (DE); Philippe Cheray, Ostfildern (DE)

(73) Assignee: Pilz GmbH & Co. KG, Ostfildern (DE)

( * ) Notice: Subject to any disclaimer, the term of this patent is extended or adjusted under 35 U.S.C. 154(b) by 310 days.

(21) Appl. No.: 16/254,864

(22) Filed: Jan. 23, 2019

(65) Prior Publication Data
US 2019/0154525 A1 May 23, 2019

Related U.S. Application Data

(63) Continuation of application No. PCT/EP2017/069699, filed on Aug. 3, 2017.

(30) Foreign Application Priority Data

Aug. 3, 2016 (DE) .................... 10 2016 114 384.7

(51) Int. Cl.
*G01L 1/20* (2006.01)
*F16P 3/14* (2006.01)
(Continued)

(52) U.S. Cl.
CPC .............. *G01L 1/205* (2013.01); *F16P 3/148* (2013.01); *G01R 27/14* (2013.01); *B60N 2/002* (2013.01);
(Continued)

(58) Field of Classification Search
CPC ........... G01L 1/20; G01L 1/205; B60N 2/002; B60R 21/01516; B60R 21/0152; G01G 19/4142
See application file for complete search history.

(56) References Cited

U.S. PATENT DOCUMENTS

| 4,441,097 A | 4/1984 | Anderson |
| 4,839,512 A | 6/1989 | Speck |

(Continued)

FOREIGN PATENT DOCUMENTS

| CA | 1304967 C | 7/1992 |
| CN | 1978252 A  *  | 6/2007 |

(Continued)

OTHER PUBLICATIONS

German language International Search Report for PCT/EP2017/069699; dated Feb. 2, 2018; 13 pp.

(Continued)

*Primary Examiner* — Herbert K Roberts
(74) *Attorney, Agent, or Firm* — Harness, Dickey & Pierce, PLC

(57) ABSTRACT

A safety device for monitoring a technical installation with a pressure-sensitive sensor. The pressure sensitive sensor having a plurality of first and second electrodes, wherein each first electrode overlaps each second electrode in an associated coupling site. Furthermore, each first electrode is spaced apart from the associated second electrode in the associated coupling site by a pressure sensitive material. Upon application of a force at the coupling site, an electrical resistance between the associated first and second electrode changes. A measuring circuitry coupled to said plurality of first and second electrodes successively determines the electrical resistance at associated coupling sites. For determining the electrical resistance at a coupling site via the associated first and second electrode, the measuring circuitry connects the further first and second electrodes to a terminal (Continued)

for receiving a defined potential to enable isolated measurement of the electrical resistance at the coupling site.

20 Claims, 10 Drawing Sheets

(51) Int. Cl.
  *G01R 27/14* (2006.01)
  *B60R 21/015* (2006.01)
  *B60N 2/00* (2006.01)
  *G01G 19/414* (2006.01)
(52) U.S. Cl.
  CPC .... *B60R 21/01516* (2014.10); *G01G 19/4142* (2013.01)

(56) References Cited

U.S. PATENT DOCUMENTS

| | | | |
|---|---|---|---|
| 4,856,993 A * | 8/1989 | Maness | A61C 19/05 |
| | | | 433/68 |
| 6,522,155 B2 | 2/2003 | Pietsch et al. | |
| 7,049,830 B1 | 5/2006 | Thinnes | |
| 7,126,353 B2 | 10/2006 | Pietsch et al. | |
| 8,276,467 B2 | 10/2012 | Fritzsche et al. | |
| 9,651,434 B2 | 5/2017 | Su et al. | |
| 2002/0021136 A1 * | 2/2002 | Pietsch | B60R 21/01516 |
| | | | 324/691 |
| 2005/0275555 A1 * | 12/2005 | Murad | B60R 21/0152 |
| | | | 340/667 |
| 2006/0144165 A1 * | 7/2006 | Pietsch | G01R 27/14 |
| | | | 73/862.045 |
| 2009/0234542 A1 * | 9/2009 | Orlewski | B60R 21/01546 |
| | | | 701/45 |
| 2016/0097689 A1 * | 4/2016 | Su | A61B 5/1036 |
| | | | 73/862.046 |

FOREIGN PATENT DOCUMENTS

| | | |
|---|---|---|
| DE | 38 87 757 T2 | 9/1994 |
| DE | 20014200 U1 | 1/2001 |
| DE | 10303409 A1 | 9/2004 |
| EP | 2528234 A1 | 11/2012 |
| GB | 2115555 A | 9/1983 |
| JP | 2001-511516 A | 8/2001 |
| JP | 2003-508779 A | 3/2003 |
| JP | 2006-64408 A | 3/2006 |
| JP | 2006-514276 A | 4/2006 |
| JP | 2013-123773 A | 6/2013 |
| JP | 2016-75672 A | 5/2016 |
| WO | WO-96/15433 A1 | 5/1996 |
| WO | WO-99/05492 A1 | 2/1999 |

OTHER PUBLICATIONS

Koren et al.; Preliminaries; excerpt of Fault—Tolerant Systems; Elsevier Inc. (Singapore); 2011; 6 pages.

English translation of International Preliminary Report on Patentability (Chapter 1) for PCT/EP2017/069699; dated Feb. 6, 2019; 6 pp.

* cited by examiner

SAFETY DEVICE FOR MONITORING A TECHNICAL INSTALLATION WITH A PRESSURE-SENSITIVE SENSOR

CROSS-REFERENCES TO RELATED APPLICATIONS

This application is a continuation of international patent application PCT/EP2017/069699, filed on Aug. 3, 2017 designating the U.S., which international patent application has been published in German language and claims priority from German patent application DE 10 2016 114 384.7, filed on Aug. 3, 2016. The entire contents of these priority applications are incorporated herein by reference.

BACKGROUND OF THE INVENTION

The present invention relates to safety systems for fail-safely monitoring technical installations and in particular to a safety device for monitoring a technical installation with a pressure-sensitive sensor.

Pressure-sensitive sensors may comprise a plurality of first electrodes and a plurality of second electrodes overlapping in an associated coupling site. Each first electrode in the associated coupling site is spaced apart from the associated second electrode by a pressure-sensitive material, such that upon application of a force at the coupling site an electrical resistance between the associated first and associated second electrodes changes. Furthermore, the safety device may comprises a measuring circuitry coupled to the plurality of first electrodes and the plurality of second electrodes and configured to successively determine the electrical resistance at the associated coupling sites.

Advances in signal acquisition and primary electronic signal processing have continuously increased the level of automation of manufacturing processes over the years. Nevertheless, human intervention is and remains an essential part of a manufacturing process, so that development in recent years has increasingly focused on optimizing the cooperation between man and machine. In particular, this cooperation must not endanger human health. A machine must therefore be enabled to perceive its environment within its working range and to recognize whether an object or a person is in the immediate vicinity. In addition to comprehensive sensor equipment with which the machine perceives its environment, this also requires error-free and safe evaluation of the signals recorded in order to enable safe hand-in-hand work by man and machine.

For example, a sensor that can detect access to or contact with a machine is disclosed in EP 2 528 234 B1 mentioned above. EP 2 528 234 B1 shows a large-area tactile sensor realized by interconnecting a large number of individual sensor cells that change their electrical properties in a defined way under mechanical load. The sensor cells can be individually contacted via electrodes arranged in columns and rows, so that a pressure distribution over the entire surface can be determined from a measurement of the electrical properties of the individual cells. The sensor can be used as a step mat in an access area to a machine or it can be placed on the surface of a machine in order to detect collisions between man and machine or an object as artificial skin.

For such pressure-sensitive safety devices, the general principles and requirements for safe design and testing are laid down in EN ISO 13856-1. In particular, the standard specifies the minimum safety requirements with regard to performance, marking and documentation.

The more sensor cells are connected together to form a sensor, the higher the local resolution of the sensor is, but the effort required for signal evaluation is also correspondingly higher. Usually, therefore, the evaluation of a larger number of sensor cells does not take place simultaneously and in parallel, but sequentially, i.e. the individual sensor cells are continuously scanned one after the other by the evaluation unit in order to determine their respective status. The more sensor cells that have to be interrogated, the longer it takes to interrogate the entire sensor. It is therefore desirable to minimize the duration of a measurement of a single sensor cell as much as possible.

In the case of a matrix-type sensor in which each electrode is coupled to several sensor cells, fault current paths can also occur if several cells are actuated simultaneously. This can lead to cells that are not loaded being recognized as activated. In other words, when several cells are actuated simultaneously, a contact may be registered at one site even though the corresponding sensor cell has not been actuated at this site. This effect, also referred to as "ghosting", means that sensors of the aforementioned type can only be used to a limited extent for safety-critical applications, since it is not possible to determine without error whether a load at a site is due to an actual load or has been caused by "ghosting". Ghosting is particularly problematic if different actions are to be carried out depending on the location where the sensor is loaded.

SUMMARY OF THE INVENTION

It is an object of the present disclosure to specify a safety device of the aforementioned type that allows rapid evaluation. Further, it is an object to provide a safety device of the aforementioned type that prevents errors caused by "ghosting". Yet further, it is an object to provide a safety device of the aforementioned type, in which each cell can be evaluated in a fail-safe manner to enable a fail-safe spatial resolution.

According to a first aspect, there is provided a safety device comprising a pressure sensitive sensor having a plurality of first electrodes and a plurality of second electrodes, wherein each first electrode overlaps each second electrode in an associated coupling site and wherein each first electrode in the associated coupling site is spaced apart from the associated second electrode by a pressure sensitive material, so that upon application of a force at the coupling site, an electrical resistance between the associated first electrode and the associated second electrode changes, a measuring circuitry coupled to said plurality of first electrodes and said plurality of second electrodes and configured to successively determine the electrical resistance at associated coupling sites; and an evaluation unit configured to provide an output signal in response to the measured electrical resistances, wherein the measuring circuitry is configured, for determining the electrical resistance at a coupling site via the associated first electrode and the associated second electrode, to connect the further first electrodes and second electrodes to a terminal for receiving a defined potential to enable isolated measurement of the electrical resistance at the coupling site.

According to a second aspect, there is provided A method for determining an output signal of a pressure sensitive sensor comprising a plurality of first electrodes and a plurality of second electrodes, wherein each first electrode overlaps each second electrode in an associated coupling site and wherein each first electrode in the associated coupling site is spaced apart from the associated second electrode by a pressure sensitive material such that upon application of a force at the coupling site an electrical resistance changes between the associated first electrode and the associated second electrode, the method comprising the steps of:

providing a measuring circuitry coupled to the plurality of first electrodes and the plurality of second electrodes and successively determining the electrical resistance at the associated coupling sites, and providing an output signal as a function of the measured electrical resistances by an evaluation unit, wherein the measuring circuitry is configured, for determining the electrical resistance at a coupling site via the associated first electrode and the associated second electrode, to connect the further first electrodes and the further second electrodes to a terminal for receiving a defined potential to enable isolated measurement of the electrical resistance at the coupling site.

It is therefore an idea of the present invention to provide an adapted measuring circuitry which connects the remaining cells during the measurement of a single cell in such a way that they cannot influence the measurement of the individual cells. This is achieved by the fact that when a cell is measured via the first associated electrode and the second associated electrode, the remaining electrodes are connected to a defined potential.

A defined potential is defined here as a potential different from the general ground terminal and may correspond, for example, to the positive potential of a supply voltage of the sensor.

The defined potential can be selected so that no residual currents can flow from the measured cell through the cells occupied by the defined potential. In the case of a matrix-like sensor, this means that both the electrodes and the columns that are not involved in the measurement of a cell are connected to the defined potential by connecting them to an appropriate terminal during the measurement. By excluding fault current paths through the cells not involved in the measurement by means of the measuring circuitry, "ghosting" can be reliably and easily avoided.

At the same time, suppressing the remaining cells can reduces the duration of a single measurement of a sensor cell. For example, a cell can be illustrated in an equivalent circuit diagram as a resistor parallel to a capacitance, whereby the charging time is significantly determined by the time taken to charge the capacitance. If the capacities of adjacent cells no longer influence the measurement, a cell can be charged and read out more quickly. Thus the readout of the entire sensor can be accelerated. Advantageously, the sensor can be operated with a lower supply voltage due to the lower overall capacity, which also reduces the overall power consumption.

In a further refinement, the measuring circuitry can comprise a first selection element configured to connect the associated first electrode to a terminal for receiving a measurement potential for determining the electrical resistance and to connect the associated second electrode to a ground terminal. The first selection element makes it possible to connect the electrodes required for the measurement of a single cell to a measurement potential and a ground terminal. At the same time, the first selection element connects the remaining electrodes with a defined potential that does not correspond to a ground terminal.

The first selection element can be a controllable switching element and may be formed from a large number of individual switching elements that are operated by a control unit. The use of a selection element makes it easy to implement and automate the circuitry according to the invention.

In a further refinement, the terminal for receiving the defined potential can be coupled to the terminal for receiving the measuring potential so that the defined potential corresponds in amount to the measuring potential. As the defined potential and the measurement potential are of the same magnitude, a single cell, which is switched with the measurement potential and ground, can be particularly well isolated from the other cells. Due to the same potential at the other electrodes, no residual currents can flow off during the measurement, which could falsify the measurement of a single cell. Corresponding amount in this context means that the potentials are equal in height, but not necessarily that the measuring potential is directly connected to the defined potential.

In a further refinement, the measuring circuitry can comprises an impedance converter which is connected on an input side to the terminal for receiving a measuring potential and is connected on an output side to the terminal for receiving the defined potential. The defined potential and the measuring potential are separated from each other by the impedance converters so that the potentials do not interfere with each other. Preferably the impedance converter has a high input resistance on the input side and a negligible small output resistance on the output side.

In a further refinement, the impedance converter can be an operational amplifier having at the input side an inverting input and a non-inverting input and at the output side an output, which is feedback to the inverting input. An operational amplifier is particularly well suited as an impedance converter, as it creates almost ideal conditions for the application at hand. In particular, the input resistance is almost infinite and the output resistance approximately zero. The defined potential thus follows the measurement potential in terms of amount without influencing it itself.

Only a single operation amplifier in the measuring circuitry may be required to separate the defined potential and the measuring potential for the measurement of all cells. The measuring circuitry may thus be realized particularly economically.

In a further refinement, the measuring circuitry can comprise a first analog-to-digital converter, and the first selection element can be configured to connect the associated first electrode to the first analog-to-digital converter. By connecting the associated first electrode to a measurement potential and a first analog-to-digital converter, while the associated second electrode is connected to a ground terminal, the resistance of a single cell can easily be determined by voltage measurement.

A series resistor can be arranged between the measuring potential and the analog-to-digital converter, so that a voltage divider is formed from the series resistor and the resistance of the cell to be determined. The voltage divider makes it particularly easy to determine precisely the resistance of the cell by measuring the voltage.

In a further refinement, the measuring circuitry can comprise testing means including a second selection element, a resistor and a second analog-to-digital converter for performing self-tests. The self-tests can detect errors during normal operation of the sensor. The second selection element can address the first and second electrodes individually, independently of the first selection element, so that test measurements can be carried out via the second analog-to-digital converter and a minimum resistance in which the resistances of the sensor are hidden. The test circuit then only includes the measuring components required for a measurement. This allows the individual measuring components to be checked for their functional capability, which further increases error safety.

In a further refinement, the second selection element can be coupled to the plurality of first electrodes and the plurality of second electrodes and can be configured to successively connect one electrode of each of the plurality of first electrodes and the plurality of second electrodes in parallel with the resistor to the second analog-to-digital converter. By means of the testing means, a row-column test can be carried out on a matrix-like sensor in which cross-connections between the large number of first electrodes and the large number of second electrodes can be detected.

In a further refinement, the testing means can be configured to cyclically switch the first selection element and second selection element to the same electrode of each of the plurality of first electrodes and the plurality of second electrodes to perform a first switching test. With the first switching test, the first selection element can be checked for correct switching.

In a further refinement, the testing means can be configured to cyclically switch the first selection element and the second selection element to the plurality of first electrodes and the plurality of second electrodes such that between the first and the second selection element each specific resistances of a coupling site is present to perform a second switching test. With the second switching test, cross-connections between the electrodes can be detected.

In a further refinement, the evaluation unit can be configured to determine the measured resistances from a measured voltage and to provide for each coupling site a first, a second or a third output signal based on the measured voltage. The evaluation unit may distinguish between three output signals which are provided as a function of the measured resistances. One of the three output signals can be generated for each cell. Likewise, the measurements of the individual cells can be aggregated so that an output signal is output representing the entire sensor.

In a further refinement, the first output signal may correspond to an error signal, the second output signal may correspond to a signal indicative of an actuated state at a coupling site, and the third output signal may correspond to a signal indicative of an unactuated state at the coupling site. The distinction between an error signal, which indicates a general error condition, a signal, which represents an actuated cell and a signal, which signals an un-actuated cell, enables a differentiated evaluation of the individual cells and a fail-safe spatial resolution.

In a further refinement, the evaluation unit can be configured to output the first output signal when the measured voltage falls below a first threshold value or exceeds a second threshold value, to output the second signal, when said measured voltage exceeds said first threshold and falls below a third threshold lying between said first threshold and said second threshold, and output said third output when said measured voltage exceeds said third threshold and falls below said second threshold. The type of output signal results from the measured voltage, which drops at the resistance of the individual cell. The first threshold corresponds to a lower limit and the second threshold corresponds to an upper limit within which a measured voltage level must be within for proper measurement. If a measured voltage level is below the lower limit, an error reaction is triggered because a cross-connection of an electrode to ground is assumed, for example due to liquid that has penetrated the sensor. If a measured voltage level is above the upper limit, the system also enters an error state. Reasons for this may include ageing, corrosion or mechanical wear of individual sensor cells as well as drift. Also a bad connection or a separation of the electrode as well as a Stuck-at-High error of an electrode can be present.

In a further refinement, the evaluation unit can be multi-channel redundant. The redundant design increases the fault safety of the safety device. The evaluation unit can be composed of two functionally identical controllers that can communicate with each other and monitor each other. Furthermore, functionally identical controllers from different manufacturers can be used to increase also diversity.

It will be understood that the features of the invention mentioned above and those yet to be explained below can be used not only in the respective combination indicated, but also in other combinations or in isolation, without leaving the scope of the present invention. Further, as used herein, the phrase at least one of A, B, and C should be construed to mean a logical (A OR B OR C), using a non-exclusive logical OR, and should not be construed to mean "at least one of A, at least one of B, and at least one of C.

BRIEF DESCRIPTION OF THE DRAWINGS

Exemplary embodiments of the invention are explained in more detail in the following description and are represented in the drawings, in which.

DETAILED DESCRIPTION OF THE PREFERRED EMBODIMENTS

Figure 1:
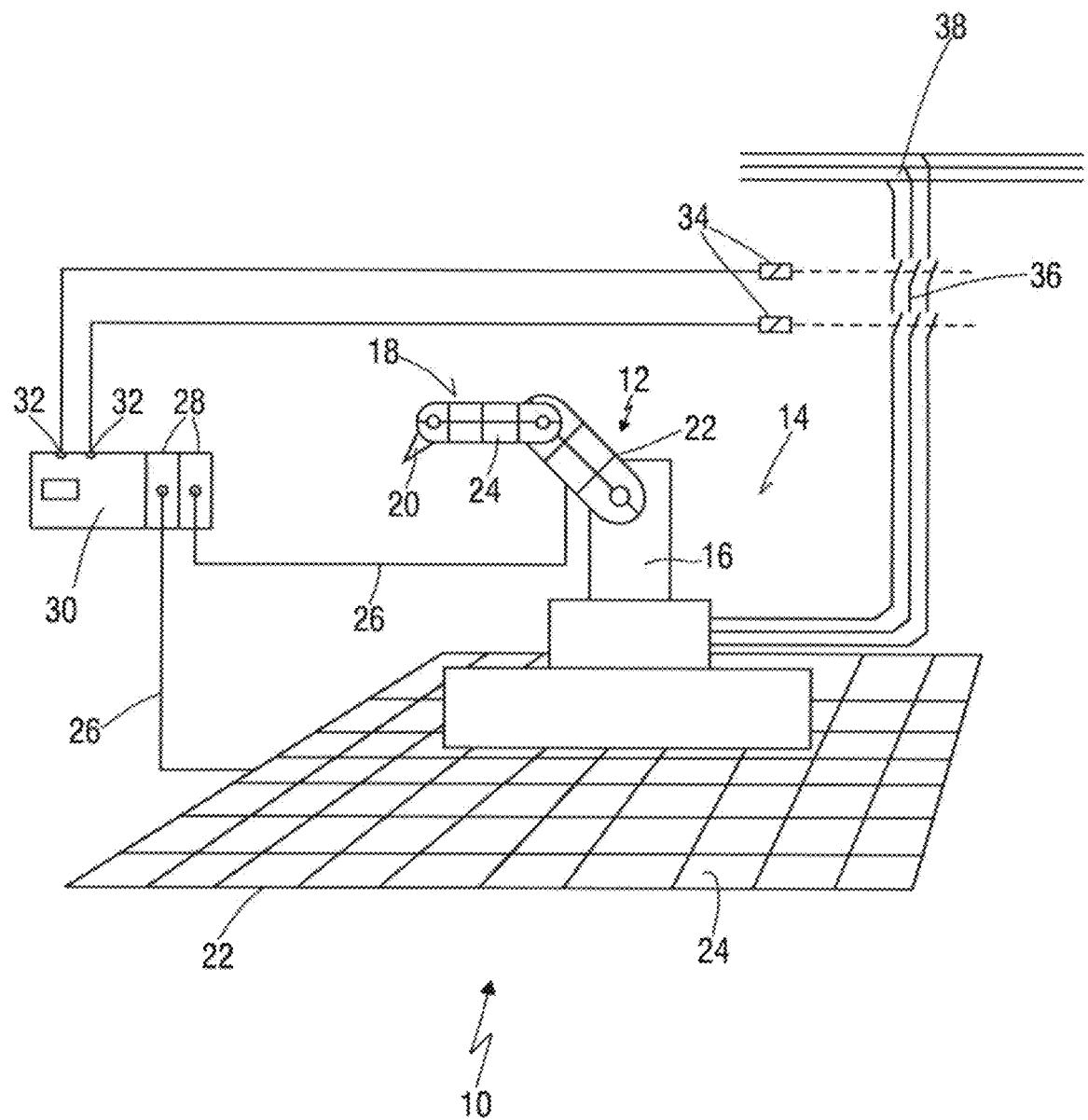
FIG. 1 shows a schematic representation of possible areas of application of examples of the new safety device.

FIG. 1 shows a schematic representation of possible areas of application of examples of the new safety device.

FIG. 1 shows two exemplary embodiments of the new safety device with reference numbers 10 and 12. Both safety devices monitor a technical system 14, which is indicated here as an automated robot 16. The robot 16 can, for example, be a cutting or welding robot in a production or assembly line.

In the exemplary embodiment shown in FIG. 1, the robot 16 to be monitored has a freely movable robot arm 18 with a tool 20 at the end. The rotation and swivel range of the robot arm 18 defines an effective range of the robot 16, which at the same time represents a hazardous range of the robot 16. Entry into the hazardous area—both unauthorized and authorized—must be detected so that the robot can be transferred into a condition which is safe for persons or objects. The detection is carried out here by safety devices 10 and 12, which are coupled with a safety system 30.

The safety system 30 can be an output switching device as defined by EN ISO 13856-1, for example a simple safety relay, a configurable safety controller or a programmable logic controller. The safety system 30 is configured to put the technical system 14 into a safe state for persons, for example by switching off the power to the technical system 14.

The first exemplary embodiment of the new safety device 10 is a step mat arranged on the floor in the area around the technical system 14. The second exemplary embodiment of the new safety device 12 is a coating of the robot arm 18, which acts here as the touch-sensitive "skin" of the robot 16. Both safety devices 10, 12 comprise a pressure-sensitive sensor 22, which is made up of a large number of individual sensor cells 24. As indicated in particular by the second application case, the sensor 22 is made of flexible material so that it can be adapted to different shapes, such as here the shape of the robot arm.

As will be explained in more detail below, sensor 22 is designed to detect a pressure change in one of the sensor cells 24 and to generate a corresponding output signal. The output signal is transmitted via lines 26 to input modules 28 of the safety system 30, which evaluates the signals and triggers a reaction depending on them. In this exemplary embodiment, the safety system 30 is connected for this purpose via outputs 32 with contactors 34 having working contacts 36 arranged in a power supply 38 of the robot 16.

If a sensor cell 24 of the step mat 10 is put under load in the hazardous area of the technical system 14 or if the robot skin 12 detects a contact of the sensor 22 with an object or a person, the safety system 30 switches off the outputs 32 so that the contactors 34 fall off and the technical system 14 is switched off by opening the working contacts 36. By disconnecting the power supply, the technical system 14 is transferred into a state safe for persons or objects.

It goes without saying that disconnecting the technical system 14 from the power supply is only one way of transferring the technical system 14 to a safe state. Alternatively or in addition, in another exemplary embodiment, the safety system 30 can also intervene in a controlling manner in the movement sequence of the robot 16 in order to bring about a safe state, for example by the robot 16 retracting the robot arm 18. It is also conceivable that the output signals of the sensors 22 of the first safety device 10 and of the second safety device 12 or the output signals of further safety devices are considered in combination and that the safety system 30 makes a decision on the control of the robot 16 from the synopsis. Other safety devices can be, for example, electrosensitive protective devices (ESPE), such as light barriers or light grids, or a safe camera system.

Figure 2:
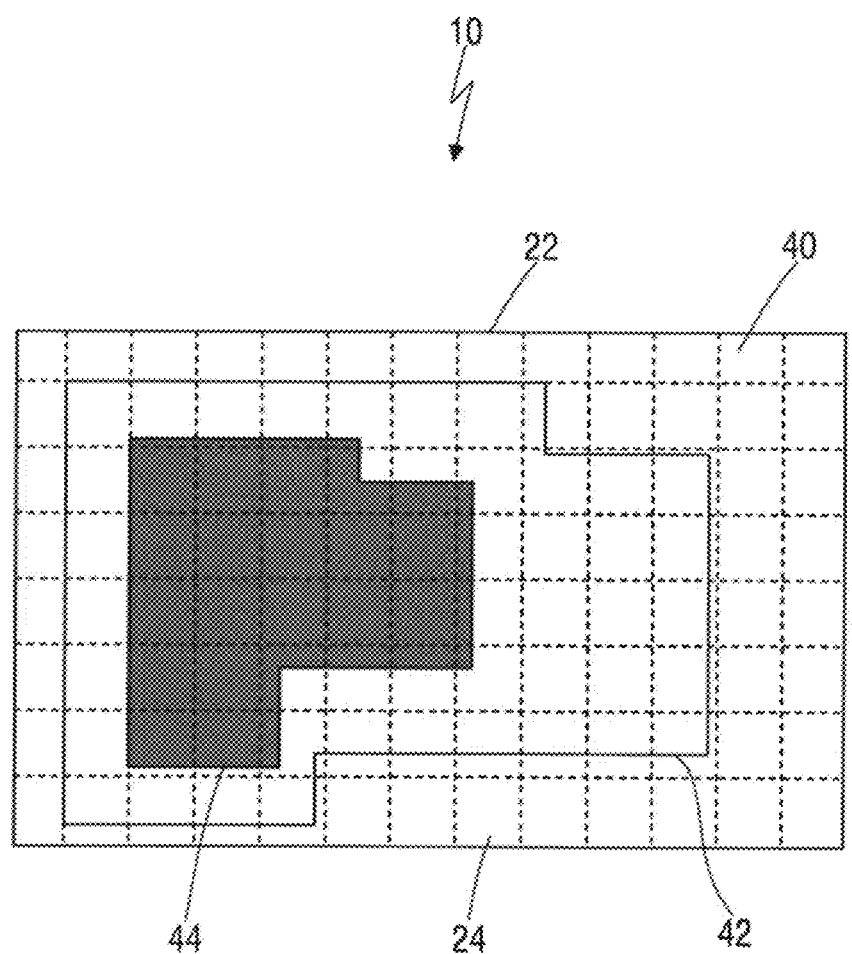
FIG. 2 shows an exemplary embodiment of the new safety device in a plan view.

FIG. 2 shows an exemplary embodiment of the new safety device 10 in a plan view.

The sensor 22 here is divided into a large number of sensor cells 24 like a matrix. In addition, the sensor 22 is divided into different areas to which different sensor cells 24 are assigned. A first area 40 (shown here without filling) forms the edge area of the sensor 22. Putting a load on the sensor cells 24 in this first area does not cause the safety device to react 10. A second area 42 (shown in light grey) forms a warning area. When a sensor cell 24 assigned to the warning range is subject to a load, safety device 10 triggers a warning signal which can, for example, cause a warning display to light up. The third area 44 (shown in dark grey) marks a protective field. As soon as a sensor cell 24 assigned to the protective field is subjected to a load, a safety function is triggered which causes the technical system 14 to be monitored to be converted into a safe state. It goes without saying that for such a functional subdivision of sensor 22, a load on each sensor cell 24 must be reliably and fail-safe detected. This means that the sensor 22 must guarantee a fail-safe spatial resolution. The assignment of a cell to a range takes place according to the priority of the corresponding output signals. If a cell comprises two areas, the higher level is assigned to each cell.

Figure 3:
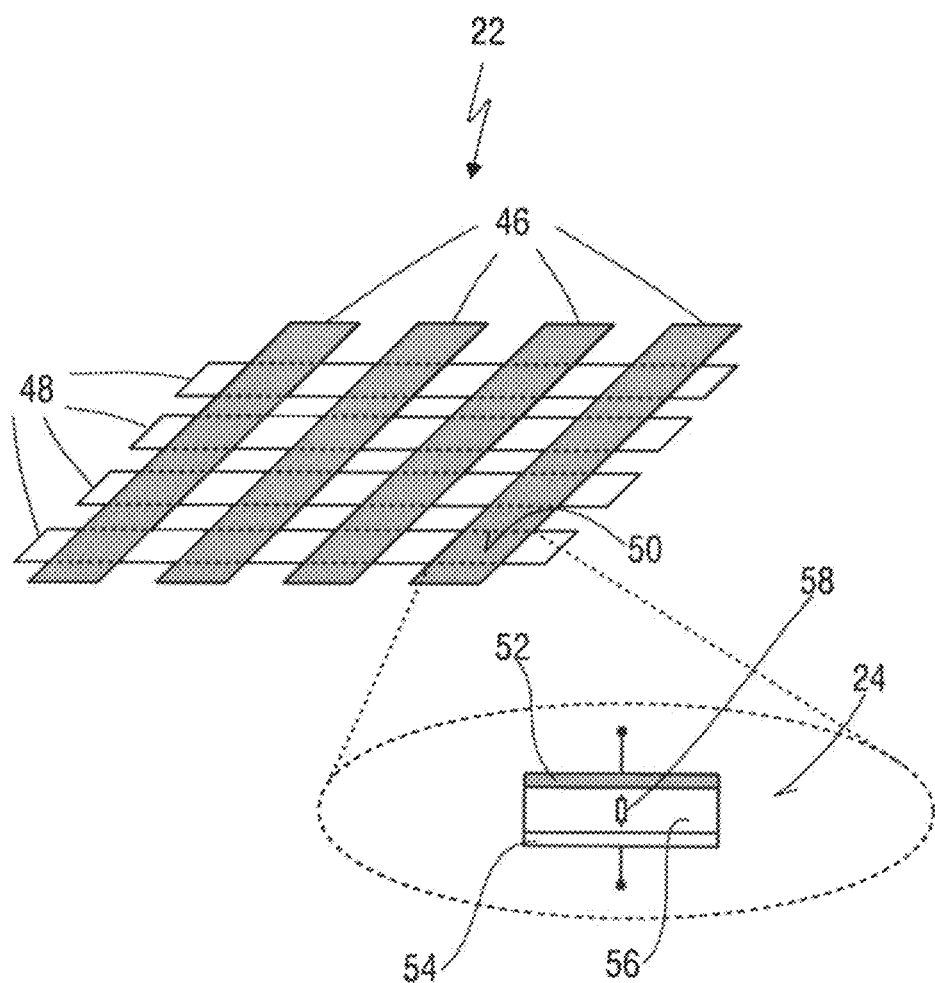
FIG. 3 shows a simplified schematic representation of the structure of an exemplary embodiment of a new sensor.

FIG. 3 shows in a simplified schematic representation the structure of an exemplary embodiment of a new sensor.

The sensor 22 has a plurality of first electrodes 46 and a plurality of second electrodes 48 overlapping each other. Every first electrode overlaps every second electrode in an associated coupling site 50. At each coupling site 50, a sensor cell 24 is formed, as shown here schematically in the magnification. A sensor cell 24 thus comprises an associated first electrode 52 and an associated second electrode 54 as well as a pressure-sensitive material 56, which separates the two electrodes 52, 54 from each other. In an exemplary embodiment, the pressure sensitive material 56 is configured to change its resistivity upon application of a force so that an electrical resistance 58 changes between the associated first electrode 52 and the associated second electrode 54 when the cell is mechanically loaded. Alternatively, the first and second electrodes 46, 48 and the pressure sensitive material 56 may also be configured to interact upon application of force such that the electrical resistance 58 varies between the associated first electrode 52 and the associated second electrode 54.

In a further exemplary embodiment, the pressure-sensitive material of the sensor can be made of a polymer interspersed with conductive additives. Measured in terms of conductivity, this material is to be classified between insulators and conductors, whereby the classification depends on the respective concentration of the conductive additives. The conductive particles are mostly soot, metallic particles, metal-coated particles or carbon fibers. The conductivity of the material is based on the principle of percolation. This results in conductive bridges that extend through the entire material. If pressure is now exerted on the material, it compresses and new bridges of conductive particles are formed. In order to use the material as a tactile sensor, a matrix-shaped mat is designed whose individual cells are made of the polymer material. For resistance evaluation, electrodes in the form of conductive threads are attached to the upper and lower sides of the pressure-sensitive material to form sensor cells in the areas where they overlap.

Figure 4:
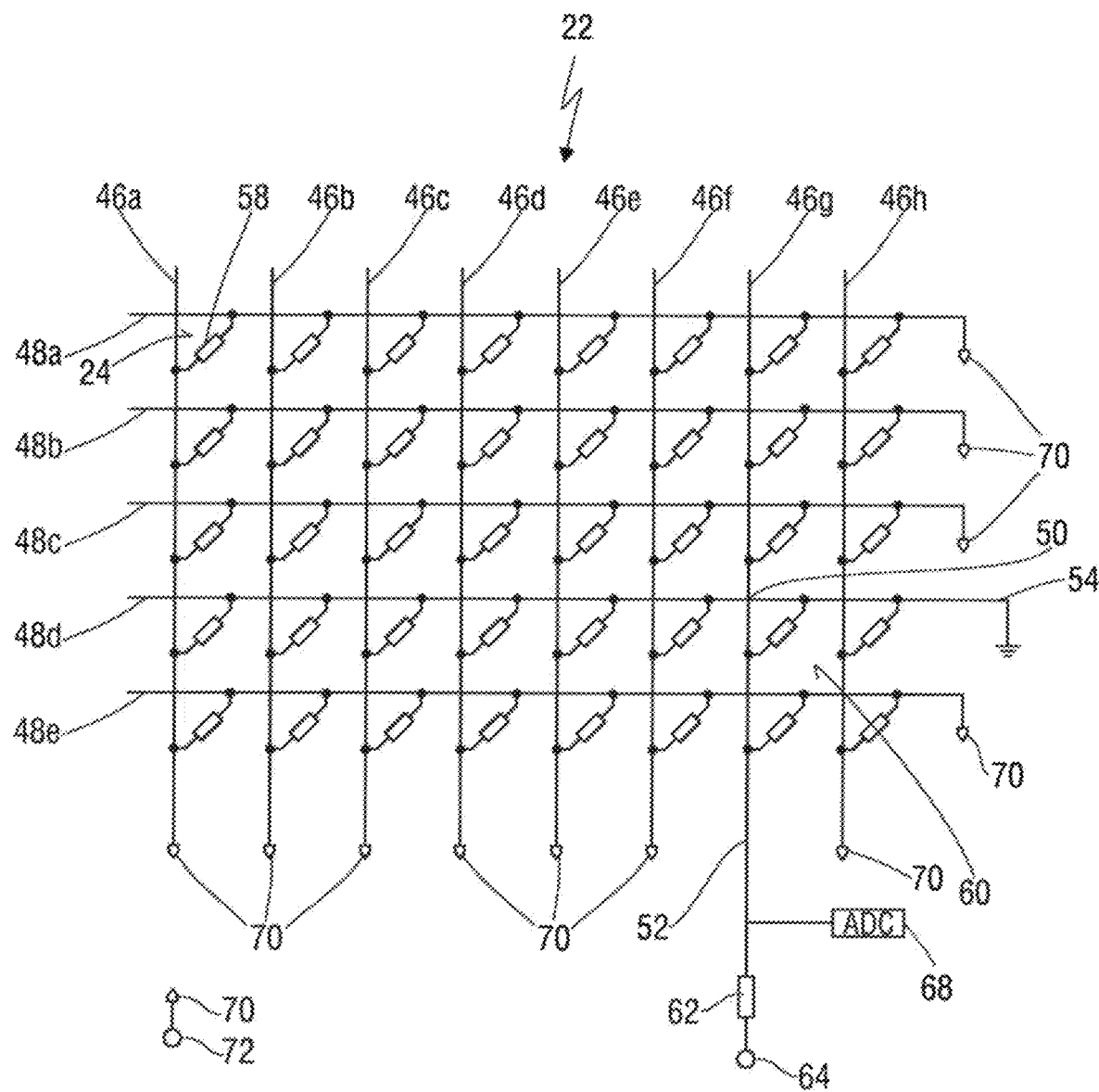
FIG. 4 shows an equivalent circuit diagram of an exemplary embodiment of the new sensor.

FIG. 4 shows an equivalent circuit diagram of an exemplary embodiment of the new sensor 22.

The plurality of first electrodes 46 is indicated by vertically running conductor paths 46a-46h. The plurality of second electrodes 48 is indicated by horizontal conductor paths 48a-48e. The first electrodes thus form the columns and the second electrodes the rows of the matrix-like sensor 22. At the intersections of the conductor paths (46a-46h, 48a-48e) are the sensor cells 24, which are indicated in the equivalent circuit diagram by their corresponding electrical resistance 58.

For a measurement of the electrical resistance 58 of a sensor cell 24, the first electrodes 46a-46h and the second electrodes 48a-48e can be alternately connected to different potentials. This is done via switching elements (not shown here), which are explained in detail with reference to FIGS. 6 and 7.

As an example, FIG. 4 shows the measurement of sensor cell 60, which is located at the coupling site 50 of the associated first electrode 46g, 52 and the associated second electrode 48d, 54. For the measurement, the associated first electrode 46g, 52 is connected via a series resistor 62 to a terminal for receiving a measurement potential 64. At the same time, the associated second electrode 48d, 54 is connected to a ground terminal 66. The series resistor 62 and the electrical resistor 58 of the sensor cell 60 form a voltage divider at which a voltage value can be determined using a first analog-to-digital converter 68. From the measured voltage value, the electrical resistance 58 of the sensor cell 60 can be determined directly, and from this the mechanical load of the sensor cell 60 can be determined.

In accordance with the invention, the remaining first electrodes 46a-46f, 46h and the remaining second electrodes 48a-48c, 48e, which are not involved in the measurement of the current sensor cell 60, are connected to a defined potential 70 during the measurement, as indicated here via the common terminal for receiving a defined potential 72. The defined potential 70 corresponds in amount to the measuring potential 74, although the defined potential 70 can be not directly connected to the measuring potential 74. The relationship between the defined potential 70 and the measuring potential 74 is explained in more detail with reference to FIG. 5.

Figure 5:
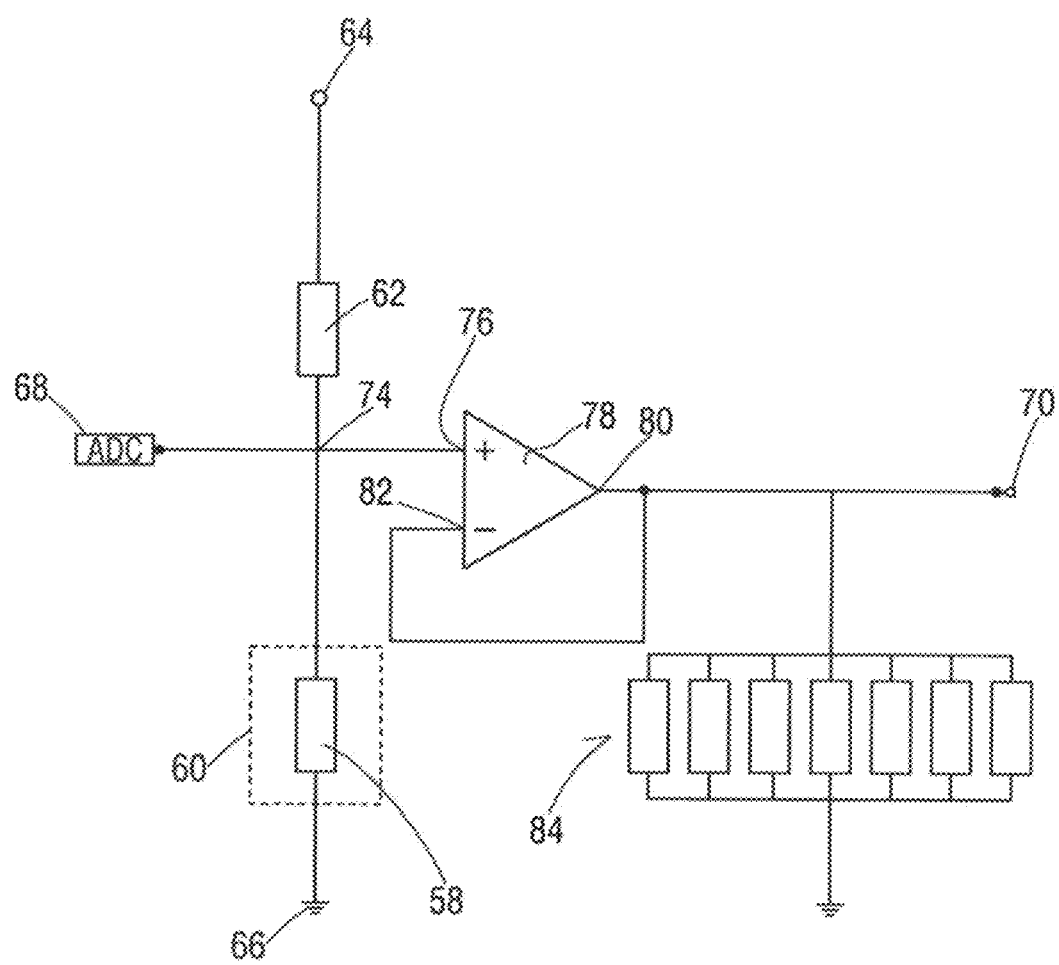
FIG. 5 shows a simplified schematic representation of a measuring circuitry of an exemplary embodiment of the new sensor.

FIG. 5 shows a simplified schematic representation of a measuring circuitry of an exemplary embodiment of the new sensor. Same reference signs designate same parts as in FIG. 4.

The electrical resistance 58 of the measured sensor cell 60 is determined by measuring the voltage at the first analog-to-digital converter 68. Preferably, the voltage dropping at the electrical resistance 58 is measured via a voltage divider in order to enable precise measurement even with strongly varying resistances 58. A series resistor 62 is thus arranged between the terminal for receiving a measuring potential 64 and the electrical resistance 58 of the sensor cell 60, so that a measuring potential 74 is adjusted between the electrical resistor 58 of the sensor cell 60 and the series resistor 62, which is received and measured by the first analog-to-digital converter 68.

The measuring potential 74 is also present at a non-inverting input 76 of an operational amplifier 78. The output 80 of the operational amplifier 78 is directly fed back to the inverting input 82 of the operational amplifier 80, so that the operational amplifier 78 functions as an impedance converter.

Output 80 is set to the defined potential 70, which corresponds in magnitude to the measuring potential 74, but is separated from it by the impedance converter. In other words, the defined potential 70 follows the measuring potential 74, but does not influence it. It goes without saying that another impedance converter can also be used instead of the operational amplifier 78. An operational amplifier, however, allows an almost ideal separation, since the input resistance at the inputs is almost infinite and an output resistance at the output is approximately zero.

The defined potential 70, coupled to the measuring potential 74 in amount, is connected to the other electrodes. Thus only the electrical resistance 58 of the sensor cell 60 to be measured is connected to the measuring potential 74 and the ground terminal 66. The other electrical resistors 58 of the same series, indicated by the reference number 84, are connected on the one hand to the ground terminal 66 and on the other hand to the defined potential 70. The other resistors of the same column (not shown here) are connected to the measuring potential 74 on the one hand and to the defined potential 80 on the other hand. Since the measuring potential 74 and the defined potential 70 are equal in amount, no residual currents can flow through the sensor cells in the same row and column, so that an isolated measurement of the sensor cell 60 is possible.

Figure 6:
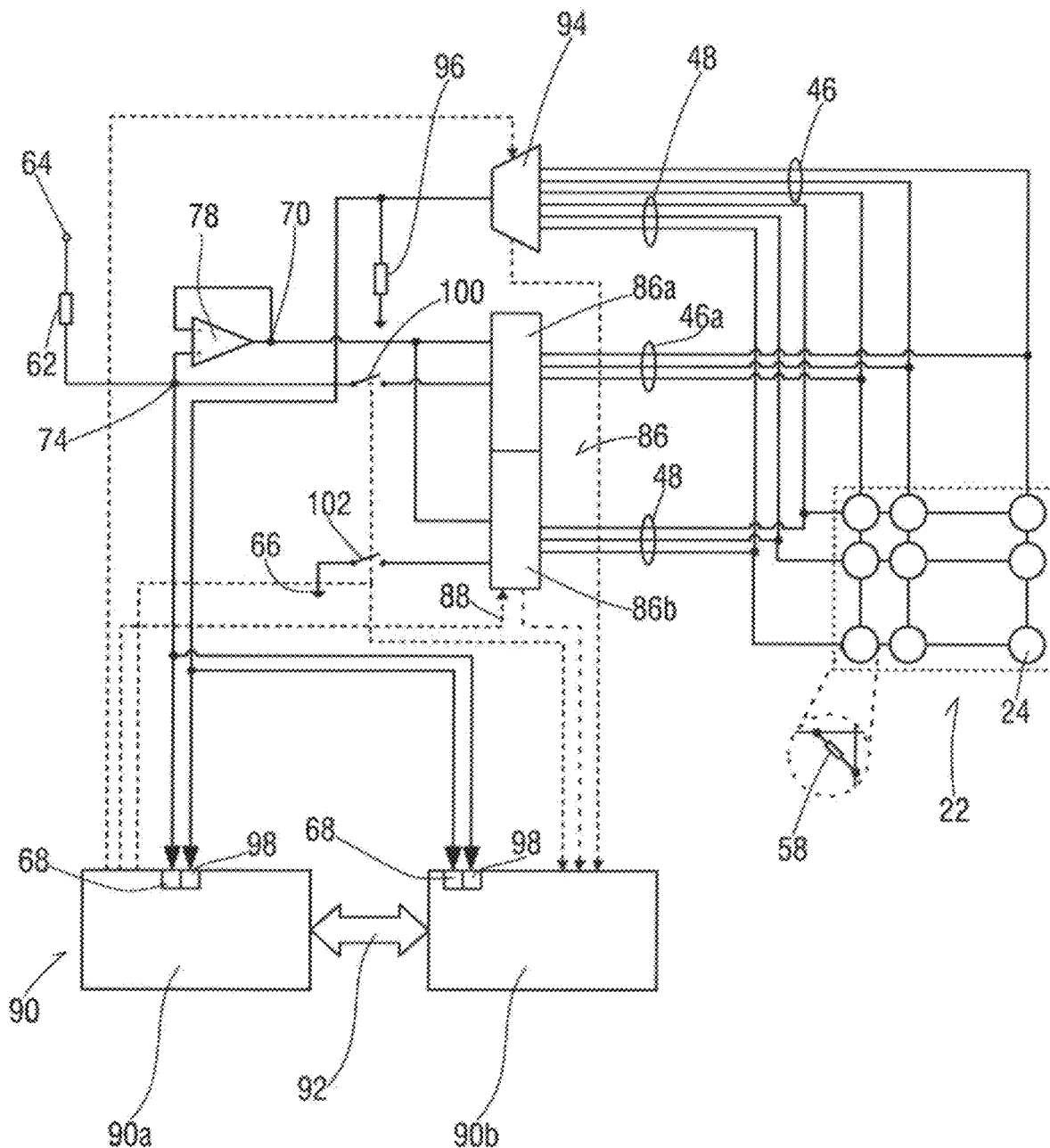
FIG. 6 shows a first exemplary embodiment of a new safety device.
Figure 7:
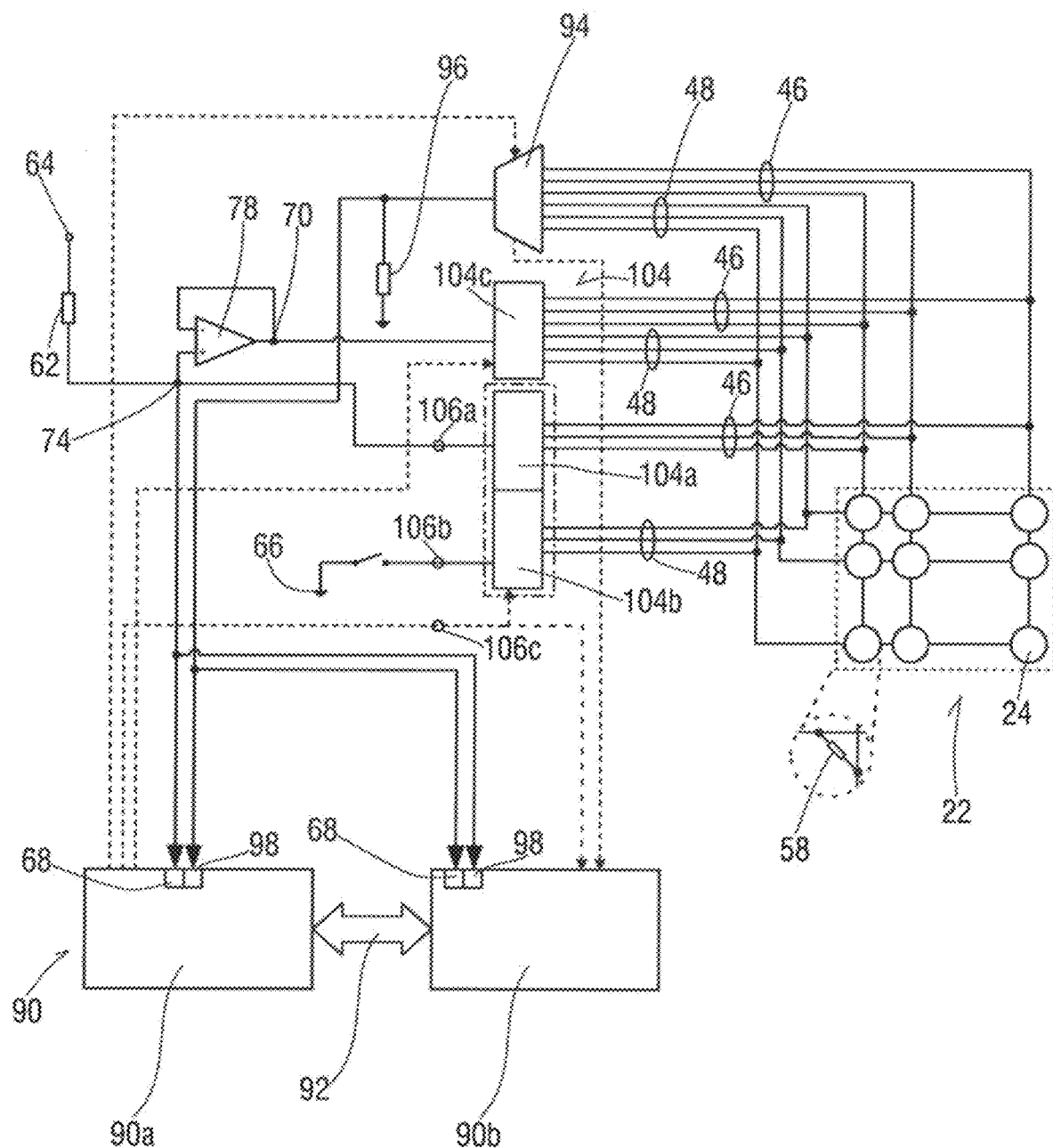
FIG. 7 shows a second exemplary embodiment of a new safety device.

FIG. 6 and FIG. 7 each show an exemplary embodiment of the new safety device. In both figures the same reference numbers denote the same parts, so that these are described in the following only in relation to a single figure.

FIG. 6 shows a first exemplary embodiment of the new safety device. The pressure-sensitive sensor 22 is illustrated here with nine sensor cells 24, which are arranged like a matrix in three columns and three rows. The different spacing of the rows and columns indicates that the sensor 22 can also have a larger number of rows and columns. Similarly, the number of rows and columns need not necessarily be the same.

The sensor cells 24 of a column are each connected to each other via a first electrode and the sensor cells 24 of a row are each connected to each other via a second electrode. The first electrodes of the columns thus form a plurality of first electrodes 46 and the second electrodes of the rows form a plurality of second electrodes 48.

The plurality of first electrodes 46 and the plurality of second electrodes 48 are connected to a first selection element 86. The selection element 86 here is indicated by two logical units 86a, 86b. The first logical unit 86a is connected on the input side to the large number of first electrodes 46 and on the output side to the measuring potential 74 on the one hand and to the defined potential 70 on the other hand, which is coupled to the measuring potential 74 via a feedback operational amplifier 78. The second logic unit 86b is connected on the input side to the plurality of second electrodes 48 and on the output side on the one hand to a ground terminal 66 and on the other hand to the defined potential 70.

The selection element 86 is configured to optionally connect the electrodes 46, 48 on the input side to the output side connections. The plurality of first electrodes 46 can thus be selectively connected to the defined potential 70 or the measuring potential 74 via the first logical unit 86a. The plurality of second electrodes 48 can be selectively connected via the second logic unit 86b to the defined potential 70 or the ground terminal 66.

The first and second units 86a, 86b of the selection element 86 are referred to as "logical", since the hardware configuration can also comprise several components, which together form the logical first and second units 86a, 86b. For example, the first selection element 86 can comprise a large number of switching elements implemented in CMOS technology that have several independent switches. An example of such a switching element is Analog Devices' HDG788, which includes four independent SPDT (single pole, double throw) switches. Using four such switching elements, a selection element 86 for an 8×8 matrix (64 cells) can be realized.

The first selection element 86 is driven via a data input 88, each switch can have its own logical input. A corresponding control signal is provided by a control unit 90, which is also the evaluation unit here. The control unit 90 can be a digital or analog circuit, a microcontroller, an FPGA, an ASIC or any other processing unit.

In the exemplary embodiment shown here, the control/evaluation unit 90 comprises two separate microcontrollers 90a, 90b, which are coupled to each other via a communication interface 92, for example a serial UART interface.

The microcontrollers 90a, 90b are functionally identical, but can be of different type or from different manufacturer in order to increase diversity. Via the communication interface 92 the microcontrollers 90a, 90b can communicate with each other and monitor and control each other. Such an arrangement is also referred to as redundant, multi-channel.

The control/evaluation unit 90 controls the first selection element 86 in such a way that each electrical resistance 58 of the sensor cells 24 of sensor 22 can be read out in one cycle. In addition, the control/evaluation unit 90 controls the testing means described in more detail below, as indicated here by the dashed arrows emanating from the first microcontroller. The second microcontroller 90b monitors the control by additionally feeding the control signals of the first microcontroller 90a to the inputs of the second microcontroller 90b. This is indicated here by the dashed arrows arriving at the second microcontroller 90b.

In this exemplary embodiment, the control unit 90 also functions as an evaluation unit and has a first analog-to-digital converter 68 for this purpose. Due to the redundant design of the control unit 90, both the first microcontroller 90a and the second microcontroller 90b have a corresponding first analog-to-digital converter 68. The first analog-to-digital converter 68 is connected to the measuring potential 74, which is here connected via a series resistor 62 to a connection for receiving a measuring potential 64. Terminal 64 can in particular be a supply voltage terminal.

As explained in detail in FIG. 5, the control unit 90 connects all sensor cells 24 in one cycle, so that the electrical resistance 58 of each sensor cell 24 can be determined via the voltage divider of series resistor 62 and electrical resistance 58 by measuring the measuring potential 74 on the first analogue-digital converter 68. At the same time, the control unit 90 controls the first selection element 86 in such a way that the electrodes not involved in the measurement are connected to the defined potential 70 so as not to influence the measurement. As shown in FIG. 6, only one impedance converter 78 is required to provide the defined potential 70 for all electrodes.

The measuring circuitry of the exemplary embodiment shown in FIG. 6 also has a testing means with which individual components of the measuring circuitry can be checked for their functionality. The testing means includes a second selection element 94, a resistor 96 and a second analog-to-digital converter 98. Like the first analog-to-digital converter 68, the second analog-to-digital converter 98 is redundant in both 90a and 90b microcontrollers. In addition, in the exemplary embodiment shown in FIG. 6, the testing means has a first and a second switching element 100, 102.

The second selection element 94 is connected on the input side to the plurality of first electrodes 46 and to the plurality of second electrodes 48. On the output side, the second selection element 94 is connected to the second analog-to-digital converter 98 on the one hand and to a ground terminal 66 via resistor 96 on the other. Via the first switching element 100 the first logical unit 86a can be separated from the measuring potential 74 and via the second switching element 102 the second logical unit 86b can be separated from the ground terminal 66. The second selection element 94 is configured to successively connect the plurality of first and second electrodes 46, 48 to the second analog-to-digital converter 98 to check the proper functioning of the first selection element 86. For such a test, the first selection element 86 and the second selection element 94 are synchronously connected to the same electrode such that the electrical resistance 58 of a sensor cell 24 is bridged so that the first and second selection elements 86, 94 are directly connected to each other. In addition, the first and second logic units 86a, 86b are configured to connect the first electrodes 46 on the input side to the measuring potential 74 and the second electrodes 48 on the input side to the ground terminal 66.

Test control and evaluation is also performed by the control/evaluation unit 90, which controls the first and second selection elements 86, 94 accordingly and measures the voltage setting with the second analog-to-digital converter 98 and compares it with an expected value.

In addition to the test indicated here, further tests can be carried out by the testing means or by individual components of the testing means. Samples of these tests are explained in detail in relation to FIG. 10.

FIG. 7 shows a second exemplary embodiment of the new safety guard. The second exemplary embodiment differs in the type and arrangement of the first selection element, which here is designated with reference number 104. In other aspects, the safety device is identical to the safety device according to the first exemplary embodiment, so that the components explained in relation to FIG. 6 with the same reference numbers will not be discussed again in the following.

The first selection element 104 in this example has three logical units 104a, 104b, 104c. The first logical unit 104a is configured to optionally connect the first electrodes 46 to the measuring potential 74. The second logic unit 104b is configured to optionally connect the second electrodes 48 to a ground terminal 66. The third logical unit 104c is configured to connect the first and second electrodes 46, 48 with the defined potential 70.

The first, second and third logical units 104a, 104b, 104c interact in such a way that a first electrode is cyclically connected to the measuring potential 74 and a second electrode to the ground terminal 66, while the remaining first and second electrodes are connected to the defined potential 70. The first, second and third logical units 104a, 104b, 104c can also be composed of a number of individual switching elements, as indicated in the first exemplary embodiment. For example, the selection element can be composed of switching elements of type ADG711 from Analog Devices, each of which has four independent SPST (single pole/singe throw) switches. With four such switching elements, a selection element 104 could be realized, which can control a sensor 22 with 8×8 sensor cells (eight first electrodes; eight second electrodes; 64 cells).

The particularity of the three logical units 104a, 104b, 104c compared to the two logical units 86a, 86b according to the exemplary embodiment in FIG. 6 is that the logical units 104a, 104b, 104c can be arranged independently of each other. In particular, the first and second logical units 104a, 104b can be detached from the measurement electronics, as indicated here by the connections 106a-c. The first and second logic units 104a and 104b can also be integrated in sensor 22 and separated from the measuring circuitry. The first and second logical units 104a, 104b could therefore be existing selection elements of an existing sensor 22, which can be reused and only supplemented by the new measuring circuitry. The control of the already existing logic elements 104a, 104b would then be carried out by the new measuring circuitry, as indicated by the connections 106a-c. Therefore, the new measuring circuitry including the new testing means can be in the form of a separate unit, for example as a plug-in board to supplement the existing electronics of a sensor. In this way, existing sensors can be easily and cost-effectively supplemented with the new functionality, in particular improved measurement of the individual cells.

Such an additional board would then only comprise a third logical unit 104c, an impedance converter 78 and a control/evaluation unit 90 as well as a testing means with a second selection element 94 and a resistor 96. The additional circuit board could be connected to the electronics of an existing sensor via external connections.

Figure 8:
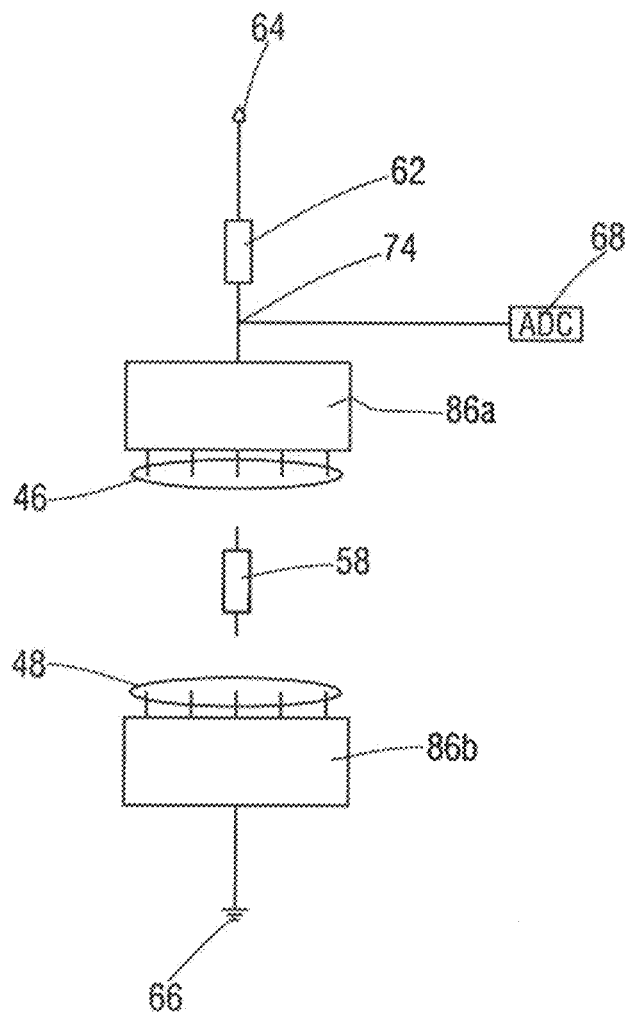
FIG. 8 shows a simplified equivalent circuit diagram of a measuring circuitry according to the exemplary embodiments according to FIGS. 6 and 7.

FIG. 8 shows a simplified equivalent circuit diagram of a measuring circuitry according to the exemplary embodiments given in FIGS. 6 and 7. The same reference symbols designate the same parts.

The first selection element 86 is represented here by two multiplexers. A multiplexer is a selection circuit with which one of a number of input signals can be selected and connected through to an output.

The multiplexers can switch cyclically from one input to the next, so that the electrical resistor 58 of a sensor cell together with the series resistor 62 forms a voltage divider between a terminal for receiving a measuring potential 64 and a ground terminal 66.

The voltage at point 74 is measured by the first analog-to-digital converter 68 and used to determine the electrical resistance 58 dependent on the load on the sensor cell. Depending on the voltage measured at point 74, the output signal is determined, which is output for the respective sensor cell. The relationship between the voltage value measured by the first analog-to-digital converter 68 and the output signal is explained in more detail below with reference to FIG. 9.

Figure 9:
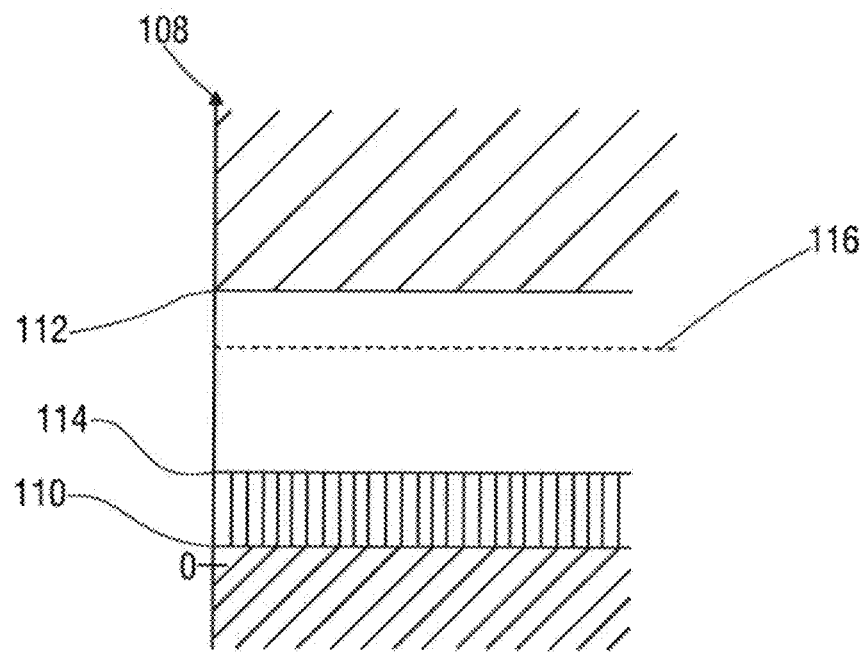
FIG. 9 shows a schematic representation of the relationship between a measured voltage and the output signal.

FIG. 9 shows in a diagram the relationship between the measured voltage and the output signal. Axis 108 represents the measured voltage and the adjacent surfaces represent the type of output signal. The reference digits 110, 112 and 114 denote a first, second and third threshold value at which the state of the output signal changes. If the measured voltage value is below the first threshold value 110, an error reaction is triggered. Reasons for falling below the first threshold value of 110 may be, for example, a cross-connection of an electrode to ground or the penetration of liquid into the sensor. If the measured voltage value is above the second threshold value 112, an error is also assumed. Reasons for exceeding the second threshold value 112 may include ageing, corrosion or mechanical wear of the sensor cells as well as drift. In addition, there may be a poor connection or separation of the electrodes or a stuck-at-high error of an electrode.

If the measured value is between the first threshold value 110 and the second threshold value 112, a correct measurement is assumed and a distinction is made between an actuated and a non-actuated sensor cell on the basis of the third threshold value 114. If the measured voltage value falls below the third threshold value 114 (low resistance), actuation of the sensor cell is assumed. If the measured voltage value exceeds the third threshold value 114 (high resistance), the sensor cell is considered to be inactive.

Reference number 116 indicates a voltage value that represents an unloaded sensor cell. If this value of the unloaded sensor cell drifts downwards, the sensor cell becomes more pressure-sensitive and actuations are already detected with less load. This does not cause any loss of safety. If the voltage value drifts upwards, the two threshold value 112 takes effect before an error can occur.

Figure 10:
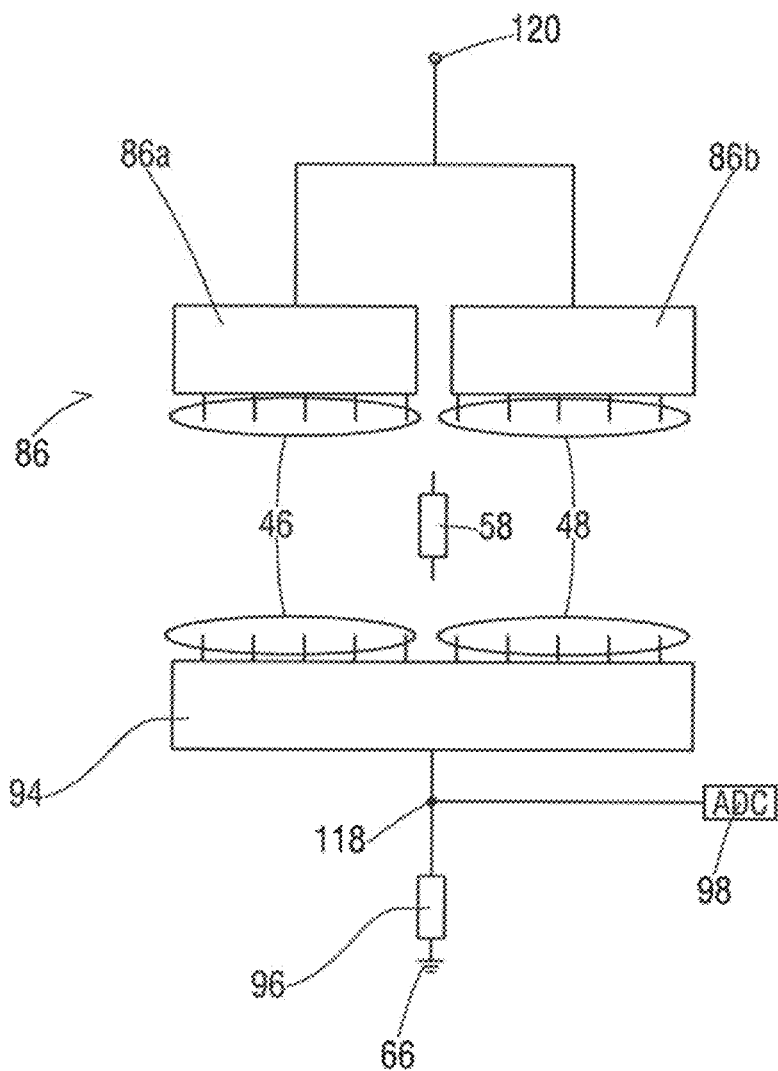
FIG. 10 shows an equivalent circuit diagram of the new testing means according to the exemplary embodiments from FIGS. 6 and 7.

FIG. 10 shows an equivalent circuit diagram of the new testing means according to the exemplary embodiments of FIGS. 6 and 7.

The circuitry shown here can be used to carry out several switching tests to check the functionality of the various components of the measuring circuitry. In the upper half of the circuit according to FIG. 10, a first selection element 86 is shown which is subdivided into a first logical unit 86a and a second logical unit 86b. It is understood that a corresponding subdivision into three logical units 104a, 104 and 104c according to the second exemplary embodiment would also be possible. The lower half of the circuit shown in FIG. 10 shows the testing means with a second selection element 94, a second analog-to-digital converter 98 and the resistor 96. The first logic unit 86a is connected to the first electrodes 46 and the second logic unit 86b is connected to the second electrodes 48. The second selection element 94 is connected to both, the first electrodes 46 and the second electrodes 48.

In a first switching test, such an arrangement enables the first selection element 86 and the second selection element 94 to be switched so that they are simultaneously connected to the same electrode of the plurality of first electrodes 46 and the plurality of second electrodes 48. Thus the electrical resistance 58 is "excluded" and the first selection element 86 and the second selection element 94 are directly connected to each other. At measuring point 118, a defined voltage value would then have to be obtained, which results from the voltage present at terminal 120 and the resistance 96. If the value determined by the second analog-to-digital converter 98 deviates from this expected value, then an error of the first selection element 86 or an incorrect switching of the first selection element 86 is to be concluded.

In a second switching test, the testing means is used to check whether there are cross-connections between the rows or columns. The first and second selection elements 86,94 are cyclically switched in such a way that a voltage divider is set via the electrical resistor 58 and the resistor 96. If the voltage value measured by the second analog-to-digital converter 98 is too low, an error is assumed because this indicates a missing connection of electrodes. An excessively high voltage value at measuring point 118 indicates cross-connections between the electrodes, cross-connections to ground, production-related electrode faults or penetration of liquid, so that a fault condition is also indicated.

It is understood that in addition to the first and second switching tests, further tests are possible by the testing means or by individual components of the testing means. For example, the functionality of the operational amplifier can be tested by appropriate wiring and depositing of expected values.

What is claimed is:

1. A safety device, comprising:
 a pressure sensitive sensor having a plurality of first electrodes and a plurality of second electrodes, wherein:
  each first electrode overlaps each second electrode in an associated coupling site, and
  for each coupling site, the associated first electrode is spaced apart from the associated second electrode by a pressure sensitive material, so that application of a force at the coupling site changes an electrical resistance between the associated first electrode and the associated second electrode:
 measuring circuitry coupled to the plurality of first electrodes and the plurality of second electrodes and configured to successively enable determination of the electrical resistance at associated coupling sites; and
 an evaluation unit configured to provide output signals for the coupling sites in response to the determined electrical resistances, respectively;

wherein, for a selected coupling site:
the measuring circuitry is configured to determine the electrical resistance at the selected coupling site by connecting:
remaining first electrodes not associated with the selected coupling site to a terminal for receiving a common potential, and
remaining second electrodes not associated with the selected coupling site to the terminal, and
the evaluation unit is configured to output one of a first output signal, a second output signal, and a third output signal as the output signal, wherein the evaluation unit selects from among the first output signal, the second output signal, and the third output signal based on a measured voltage of the selected coupling site.

2. The safety device according to claim 1, wherein the measuring circuitry comprises a first selection element configured to:
connect the associated first electrode to a terminal for receiving a measurement potential, and
connect the associated second electrode to a ground terminal.

3. The safety device according to claim 2, wherein the terminal for receiving the common potential is coupled to the terminal for receiving the measuring potential so that the common potential follows the measuring potential.

4. The safety device according to claim 2, wherein the measuring circuitry comprises an impedance converter that is:
connected on an input side to the terminal for receiving a measuring potential, and
connected on an output side to the terminal for receiving the common potential.

5. The safety device according to claim 4, wherein the impedance converter is an operational amplifier including:
at the input side, an inverting input and a non-inverting input, and
at the output side, an output that is fed back to the inverting input.

6. The safety device according to claim 2, wherein:
the measuring circuitry further comprises a first analog-to-digital converter, and
the first selection element is configured to connect the associated first electrode to the first analog-to-digital converter.

7. The safety device according to claim 6, wherein:
the measuring circuitry comprises a testing circuit for performing self-tests; and
the testing circuit includes:
a second selection element,
a resistor, and
a second analog-to-digital converter.

8. The safety device according to claim 7, wherein:
the second selection element is coupled to the plurality of first electrodes and the plurality of second electrodes, and
the second selection element is configured to successively connect one electrode of each of the plurality of first electrodes and the plurality of second electrodes in parallel with the resistor to the second analog-to-digital converter.

9. The safety device according to claim 7, wherein the testing circuit is configured to cyclically switch the first selection element and second selection element to the same electrode of each of the plurality of first electrodes and the plurality of second electrodes to perform a first switching test.

10. The safety device according to claim 7, wherein the testing circuit is configured to cyclically switch the first selection element and the second selection element to the plurality of first electrodes and the plurality of second electrodes such that between the first and the second selection element each specific resistance of a coupling site is present to perform a second switching test.

11. The safety device according to claim 1, wherein:
the first output signal corresponds to an error signal,
the second output signal corresponds to a signal indicative of an actuated state at a coupling site, and
the third output signal corresponds to a signal indicative of an unactuated state at the coupling site.

12. The safety device according to claim 1, wherein the evaluation unit is configured to:
output the first output signal in response to the measured voltage falling below a first threshold value;
output the first output signal in response to the measured voltage exceeding a second threshold value;
output the second output signal in response to the measured voltage exceeding the first threshold value and falling below a third threshold value, wherein the third threshold value is between the first threshold value and the second threshold value; and
output the third output signal in response to the measured voltage exceeding the third threshold value and falling below the second threshold value.

13. The safety device according to claim 1, wherein the evaluation unit is multi-channel redundant.

14. A method for determining an output signal of a pressure sensitive sensor including a plurality of first electrodes and a plurality of second electrodes, wherein each first electrode overlaps each second electrode in an associated coupling site and wherein each first electrode in the associated coupling site is spaced apart from the associated second electrode by a pressure sensitive material such that upon application of a force at the coupling site an electrical resistance changes between the associated first electrode and the associated second electrode, the method comprising the steps of:
providing measuring circuitry coupled to the plurality of first electrodes and the plurality of second electrodes and successively determining the electrical resistance at the associated coupling sites; and
providing an output signal as a function of the measured electrical resistances by an evaluation unit;
wherein the measuring circuitry is configured, for determining the electrical resistance at a coupling site via the associated first electrode and the associated second electrode, to connect remaining first electrodes not associated with the coupling site and the remaining second electrodes not associated with the coupling site to a terminal for receiving a common potential to enable isolated measurement of the electrical resistance at the coupling site; and
wherein the evaluation unit is configured to, for each coupling site:
select from among a first output signal, a second output signal, and a third output signal based on a measured voltage of the coupling site, and
output the selected one of the first output signal, the second output signal, and the third output signal.

15. A method for determining an output signal of a pressure sensitive sensor including a plurality of first electrodes and a plurality of second electrodes, wherein each first electrode overlaps each second electrode in an associated coupling site and wherein each first electrode in the associated coupling site is spaced apart from the associated second electrode by a pressure sensitive material such that upon application of a force at the coupling site an electrical resistance changes between the associated first electrode and the associated second electrode, the method comprising:

for a selected coupling site:
- connecting an associated one of the first electrodes to a first potential;
- connecting remaining ones of the first electrodes to a terminal for receiving a common potential;
- connecting an associated one of the second electrodes to a second potential;
- connecting remaining ones of the second electrodes to the terminal;
- measuring a voltage at the selected coupling site; and
- in response to the measured voltage, selecting one of a first output signal, a second output signal, and a third output signal for generation as the output signal.

16. The method of claim 15 wherein:
the first output signal indicates an error condition;
the second output signal indicates an actuated state at the selected coupling site; and
the third output signal indicates an unactuated state at the selected coupling site.

17. The method of claim 15 wherein:
the first potential is a non-zero measurement potential; and
the second potential is a ground potential.

18. The method of claim 15 further comprising repeating the connecting, the measuring, and the generating for each of the associated coupling sites in turn.

19. The method of claim 15 further comprising controlling the common potential to match the voltage at the selected coupling site.

20. The method of claim 19 wherein the controlling is performed by:
- connecting the selected coupling site to a first input of an amplifier; and
- feeding the common potential back to a second input of the amplifier.

* * * * *